United States Patent [19]

Adachi

[11] Patent Number: 5,046,160
[45] Date of Patent: Sep. 3, 1991

[54] MASTERSLICE INTEGRATED CIRCUIT DEVICE HAVING AN IMPROVED WIRING STRUCTURE

[75] Inventor: Kazuo Adachi, Tokyo, Japan

[73] Assignee: NEC Corporation, Tokyo, Japan

[21] Appl. No.: 547,000

[22] Filed: Jul. 2, 1990

[30] Foreign Application Priority Data

Jun. 30, 1989 [JP] Japan .................................. 1-169071

[51] Int. Cl.⁵ ...................... H01L 21/94; H01L 21/78
[52] U.S. Cl. ........................................ 357/68; 357/71; 357/45
[58] Field of Search ........................ 357/45, 68, 71, 47, 357/48, 49, 50, 52, 54

[56] References Cited

U.S. PATENT DOCUMENTS

| 3,707,036 | 12/1972 | Okabe et al. | 357/48 |
| 3,999,214 | 12/1976 | Cass | 357/48 |
| 4,001,869 | 1/1977 | Brown | 357/48 |
| 4,032,962 | 6/1977 | Balyoz et al. | 357/48 |

Primary Examiner—Rolf Hille
Assistant Examiner—S. V. Clark
Attorney, Agent, or Firm—Sughrue, Mion, Zinn, Macpeak & Seas

[57] ABSTRACT

A masterslice integrated circuit device has a basic cell array which is composed of basic cells of a first group and basic cells of a second group. An insulating layer covers the basic cells belonging to the second group, and a wiring is connected to the basic cells belonging to the first group to constitute a circuit having a function intended and extends on the insulating layer above the basic cells belonging to the second group.

10 Claims, 3 Drawing Sheets

MASTERSLICE INTEGRATED CIRCUIT DEVICE HAVING AN IMPROVED WIRING STRUCTURE

BACKGROUND OF THE INVENTION

1. Field of the Invention

This invention relates to a masterslice integrated circuit device, and more particularly to a structure of an improved degree of integration.

2. Description of Related Art

Recently, a requirement to produce integrated circuit devices of different functions with a low manufacturing cost and a short manufacturing time has been enhanced. In response to this requirement, a masterslice technique is a most useful one in which basic cells including circuit elements such as transistors, diodes and resistors are commonly fabricated by impurity diffusion process, and in some cases, all contact holes for leading-out electrodes are commonly formed, in advance, on a master semiconductor substrate, and thereafter, at a wiring process, personalization wirings are made utilizing different masks to connect the elements to each other to obtain a desired function for a specific application. The masterslice techniques are described, for example, in U.S. Pat. Nos. 4,500,906, 4,523,106, 4,661,815, 4,737,836, 4,771,327 and 4,825,276.

FIG. 1 is a plan view to show a prior art IC device of masterslice technique and FIG. 2 is a cross-sectional view along the line B—B' in FIG. 1 as viewed in the direction of arrows. A semiconductor substrate 1 is composed of a P-type silicon body 1, an N-type epitaxial layer which forms a plurality of collector regions 13 formed on the silicon body 1, N+-type buried layers 14 positioned between the collection regions 13 and the silicon body 1, a P-type isolation region 12 having a grid-like plan shape and surrounding every collector region 13, P-type base regions 15 formed on the respective N-type collector regions, N+-type emitter regions 17 formed on the respective P-type base regions, N+-type collector contact regions 16 formed in the respective N-type collector regions, and an insulating film 18 including a thick field insulating layer at least on the P-type isolation region 12. The N-type collector region 13 defines every basic cell region so that the basic cell is constituted of one bipolar transistor, and a wiring forming region 22 or a channel region for forming wirings, of a grid-like plan shape is provided on the insulating film 18 just above the P-type isolation region 12. Contact holes 4 are formed in the insulating film 18, and aluminum electrodes 5 are connected to the emitter and collector contact regions 17, 16 via polycrystalline silicon electrodes 3 through the contact holes 4, and to the base regions 15 directly through contact holes 4. After necessary impurity diffusion process steps for forming the base regions, the emitter regions and the collector contact regions, the isolation region, etc. and the process steps for forming the above-mentioned electrodes have been performed, the semiconductor substrate in wafer state may be stored as a masterslice substrate. When functions to be provided in the IC device are determined, personalization wirings 6 of aluminum are formed to connected selected transistors to each other to form a predetermined circuit having the desirable functions. In FIGS. 1 and 2, the transistors 2a are elements (basic cells) which are used to form a predetermined circuit while the transistors 2b are elements (basic cells) of not necessary to be used here. Therefore, the aluminum electrodes 5 of the elements 2b which are not in use are not connected to other elements, whereas the aluminum electrodes 5 of the elements 2a which are in use are connected to other elements via aluminum wirings 6. The aluminum wirings 6 are formed on wiring forming regions 22 provided between elements, that is, between the basic cells 20.

The aforementioned prior art IC device of masterslice technique has, however, a problem in that a certain space (width) $W_1$ should be given between adjacent elements (basic cells) in order to secure the formation of the personalization wirings 6, although a sufficient isolation itself between collector regions 13 can be obtained even if the P-type isolation regions 12 would be narrower. The prior art IC device, therefore, cannot be integrated beyond a certain degree and poses a difficulty in increasing the integration.

SUMMARY OF THE INVENTION

Accordingly, it is an object of the present invention to provide a masterslice integrated circuit device in which personalization wirings to form a prescribed circuit of an intended function can be securely formed without sacrificing the integration of the IC device.

According to a feature of the present invention, there is provided a masterslice integrated circuit device which comprises a masterslice substrate, an insulating layer pattern and a wiring structure. The masterslice substrate includes a plurality of basic cells formed on a semiconductor substrate and arranged in a matrix form with keeping an interval from each other; the basic cells belonging to a first group are used to form a prescribed circuit of the IC device by connecting the wiring structure, and each of remaining the basic cells belonging to a second group is electrically isolated from another basic cell so that every circuit of the IC device is constructed without using the basic cells belonging to the second group. The insulating layer pattern is formed on and covers the basic cells belonging to the second group and is absent on the basic cells belonging to the first group. And the wiring structure is connected to the basic cell belonging to the first group and extends on the insulating layer pattern above the basic cell belonging to the second group.

DESCRIPTION OF THE EMBODIMENTS

Figure 6:
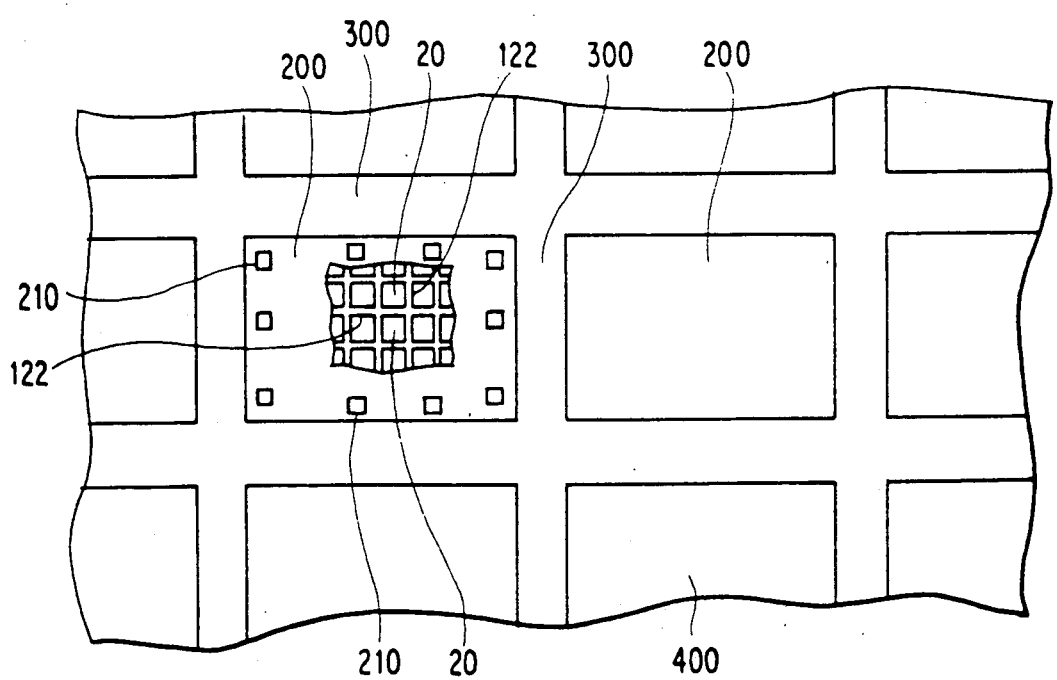
FIG. 6 is a plan view showing a semiconductor wafer in which a plurality of semiconductor devices (semiconductor chips) of the present invention are installed.

Referring to FIG. 6, on a silicon wafer 400 a plurality of IC devices (chips) 200 of the present invention are formed and arranged in a matrix form, and a plurality of chip dividing lines 300 delineates and surrounds every IC device 200. The IC device 200 has a plurality of bonding pads 210 at its periphery section, and a matrix array of basic cells 20 of the present invention at its center section.

Figure 1:
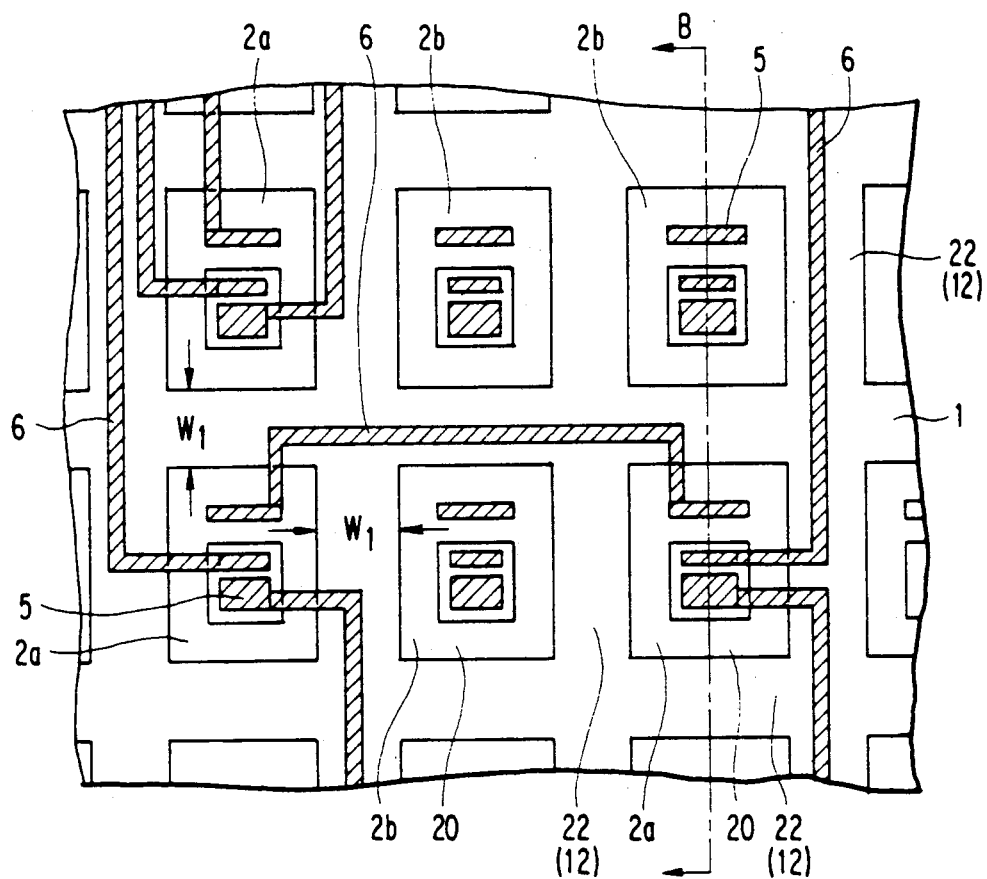
FIG. 1 is a plan view showing a conventional masterslice integrated circuit device.
Figure 2:
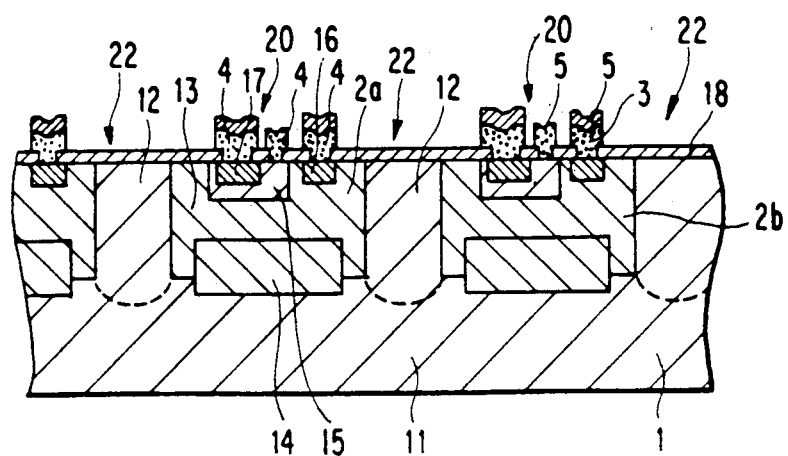
FIG. 2 is a cross-sectional view taken along the line B—B' of FIG. 1 as viewed in the direction of arrows.
Figure 3:
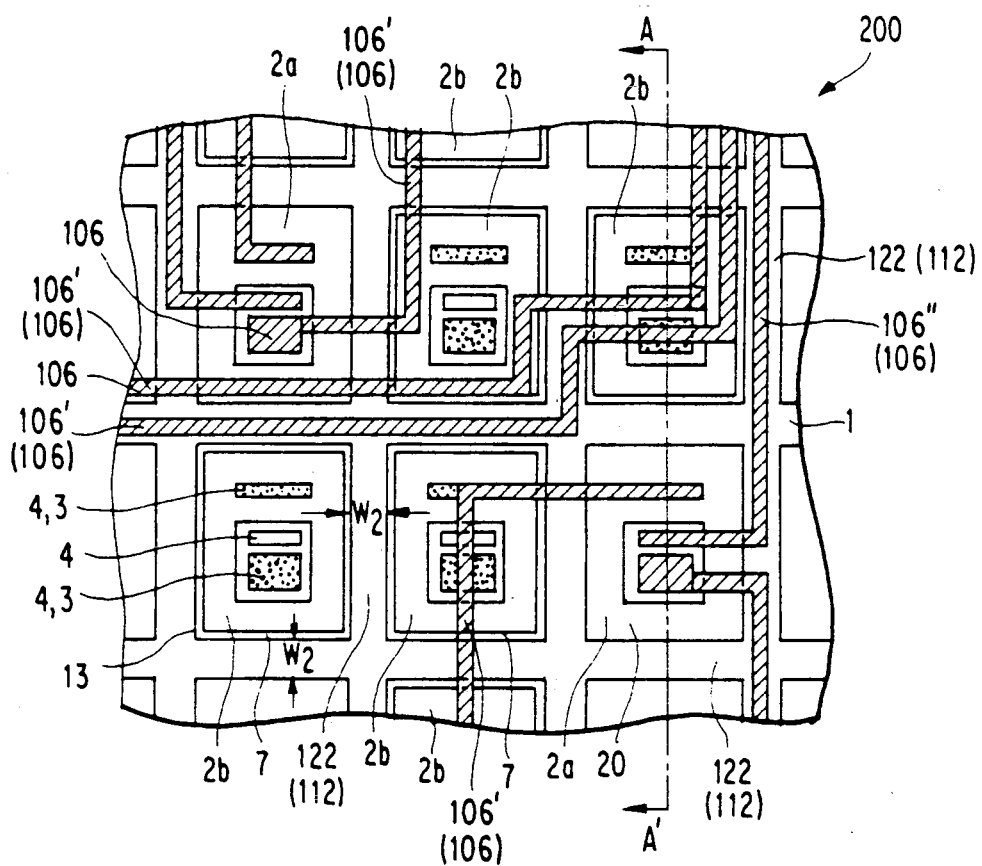
FIG. 3 is a plan view showing an embodiment of the present invention.
Figure 4:
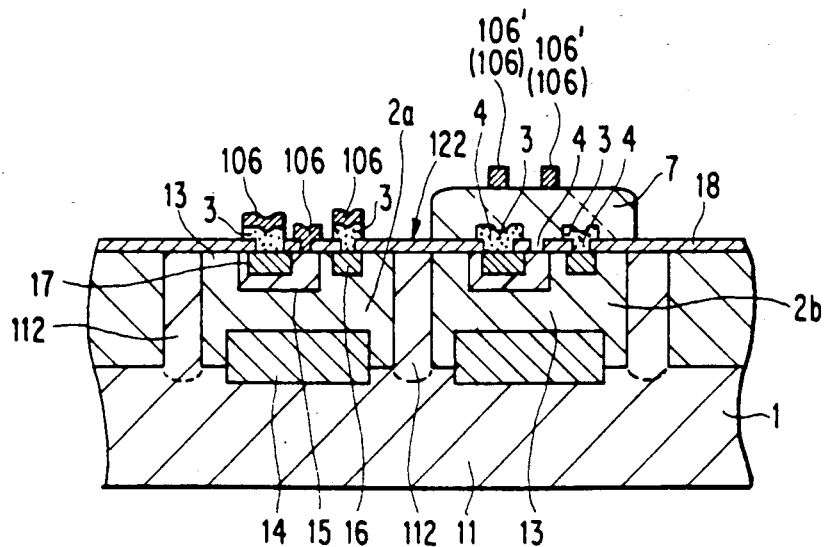
FIG. 4 is a cross-sectional view taken along the line A—A' of FIG. 3 as viewed in the direction of arrows.

Referring to FIGS. 3 and 4, a first embodiment of the present invention will be explained. In FIGS. 3 and 4, the same components as those in FIGS. 1 and 2 are indicated by the same reference numerals. After necessary impurity diffusion process steps for forming the base region 15, the emitter region 17, the collector contact regions 16 and a $P^+$-type isolation region 112, etc. and the process steps for forming contact holes 4 and polycrystalline silicon electrodes 3 with respect to the all transistors 2a, 2b, the semiconductor substrate in the wafer state is stored as a masterslice substrate. The stored masterslice substrate, wafer may includes a silicon oxide film entirely deposited on the transistor elements (basic cells) 2a, 2b including the polycrystalline silicon electrodes 3. The silicon oxide film may be deposited through, for example, a chemical vapor deposition (CVD) method by a thickness of 5000 Å. According to a circuit or circuits to be provided in the IC device for obtaining functions intended, each of the transistors as the basic cells is classified into a first group (2a) which is used in the circuit and a second group (2b) which is not used in any circuit in the IC device and is electrically isolated from another transistor (basic cell). The silicon oxide film is patterned so that silicon oxide layers 7 having a thickness of 5000 Å and an island-like plan shape are formed on the respective non-used transistors (basic cells) 2b and the silicon oxide film is entirely removed from on the respective used transistors (basic cells) 2a. The silicon oxide layer 7 formed on the polycrystalline silicon emitter and collector electrodes 3 and filling the base contact hole 4 of the non-used transistor 2b has a substantially equal area to or somewhat larger area than the transistor (basic cell) 2b as shown in FIG. 4, so that the silicon oxide layer 7 completely covers the non-used transistor (basic cell) 2b. Incidentally, in FIG. 3, the layer 7 is represented a little within the transistor area 13 to distinguish clearly the non-used transistor 2b from the used transistor 2a. Thereafter, an aluminum film is entirely deposited followed by a patterning process step to form personalization wirings 106 to form a predetermined circuit having the intended functions. The wirings includes portions 106' which is formed on the island-like silicon oxide layer 7 above the non-used transistor 2b, and portion 106'' which is formed on a grid-like wiring forming region (channel region) 122 just above the $P^+$-type grid-like isolation region 112. According to the present invention, the wiring 106 connected to the base region of the transistor 2a directly and to the emitter or collector contact region of the transistor 2a through the polycrystalline silicon electrode can extend on the transistor 2b freely via the insulating layer 7, and therefore, the width $W_2$ of the wiring forming region 122 can be narrow, thereby enhancing the integration of the IC. The tip of the aluminum wiring 106 can be regarded as a metallic electrode, and in case of emitter and collector contact cases, the tip of the wiring 106 is stacked just on the polycrystalline silicon electrode 3 with the same plan shape.

Figure 5:
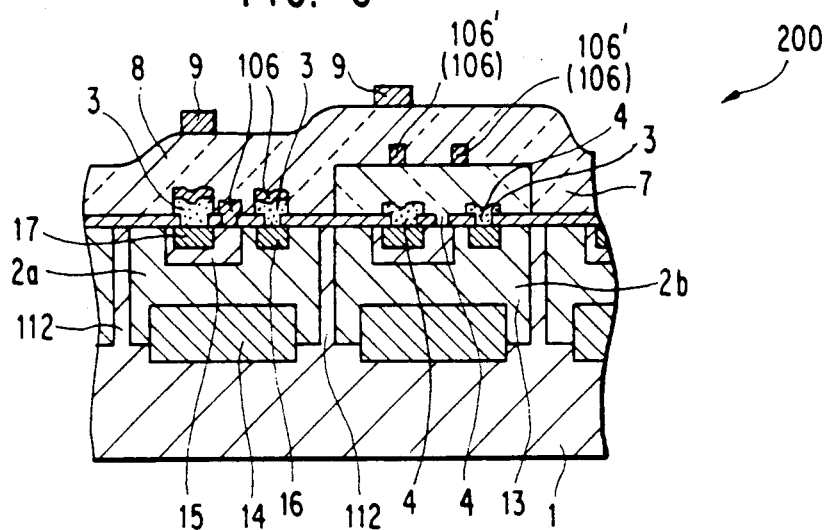
FIG. 5 is across-sectional view showing another embodiment of the present invention.

FIG. 5 shows a second embodiment of the present invention, in which the same components as those in FIGS. 3 and 4 are indicated by the same reference numerals. A second aluminum wiring 9 is formed on each aluminum wiring 106 including portions 106', 106'' (FIG. 3) via an inter-ply insulating film 8 to provide a two-layer aluminum wiring structure. Compared to the first embodiment, the degree of freedom in wiring increases as well as the wiring forming region 122 (FIG. 3) can be narrowed to thereby enable further high integration.

In the embodiments mentioned above the basic cell is constituted of only one bipolar transistor. However, the basic cell may be constituted of another active or passive element such as FET, diode and resistor, or else of plural active and/or passive elements. Further, the silicon oxide layer 7 may be replaced by another inorganic material such as silicon nitride and silicate glass, or by organic material such as polyimide.

As described in detail in the foregoing statement, according to the IC device of masterslice type of the present invention, insulating layers are applied on elements which are not used so that the areas of these elements may be used for wiring to thereby permit narrowing the interval spaces between adjacent elements and enhance the degree of integration in the IC device.

What is claimed is:

1. A masterslice integrated circuit device comprising a masterslice substrate, an insulating layer pattern and a wiring structure, said masterslice substrate including a plurality of basic cells formed on a semiconductor substrate and arranged in a matrix form, said plurality of basic cells being divided into a first group and a second group, each of said basic cells having a quadrangular shape, said basic cells belonging to said first group being connected to said wiring structure to form a prescribed circuit in said device, and each of said basic cells belonging to said second group being electrically isolated from other basic cells belonging to said first and second groups so that said prescribed circuit in said device is constructed without using said basic cells belonging to said second group, said insulating layer pattern including a plurality of quadrangular sections each having substantially the same size as said quadrangular shape of said basic cells, said quadrangular sections of said insulating layer pattern being exclusively formed on said basic cells of said second group to substantially cover said basic cells belonging to said second group, respectively, and said quadrangular sections of said insulating layer pattern being absent on said basic cells belonging to said first group so that said basic cells belonging to said first group are free from said insulating layer pattern thereon, and said wiring structure being connected to said basic cells belonging to said first group and extending on said insulating layer pattern above said basic cells belonging to said second group.

2. A masterslice integrated circuit device of claim 1 further comprising an insulating film formed on a major surface of said semiconductor substrate and contact holes formed in said insulating film to expose impurity regions of said basic cells belonging to said first and second groups.

3. A masterslice integrated circuit device of claim 2 further comprising a polycrystalline silicon electrode formed in said contact hole to connected to said exposed impurity region of every said basic cell belonging to said first and second groups so that said wiring structure is connected to said polycrystalline silicon electrode of said basic cell belonging to said first group, and that said polycrystalline silicon electrode of every said basic cell belonging to said second group is covered with said insulating layer pattern.

4. A masterslice integrated circuit device of claim 1, in which said wiring structure is made of aluminum.

5. A masterslice integrated circuit device of claim 1, in which said insulating layer pattern is made of silicon oxide.

6. A masterslice integrated circuit device of claim 1, in which said insulating layer pattern is made of polyimide.

7. A masterslice integrated circuit device of claim 1, in which each of said basic cells is constituted of one bipolar transistor.

8. A masterslice integrated circuit device of claim 7 further comprising an insulating film formed on a major surface of said semiconductor substrate and emitter, base and collector contact holes formed in said insulating film to expose emitter, base and collector portions of every transistor belonging to said first and second groups.

9. A masterslice integrated circuit device of claim 8 further comprising a polycrystalline silicon emitter electrode formed in said emitter contact hole and connected to said emitter portion of every transistor belonging to said first and second groups, and a polycrystalline silicon collector electrode formed in said collector contact hole and connected to said collector portion of every transistor belonging to said first and second groups, so that said wiring structure is connected to said emitter and collector portions through said polycrystalline silicon emitter and collector electrodes, respectively, and to said base portion via said base contact hole of said transistor belonging to said first group, and that said polycrystalline silicon emitter and collector electrodes of every transistor belonging to said second group are covered with said insulating layer pattern and said base contact hole of every transistor belonging to said second group is filled with said insulating layer pattern.

10. A masterslice integrated circuit device of claim 1 further comprising an intermediate insulating layer covering said wiring structure and said insulating layer pattern entirely, and an upper level wiring pattern formed on said intermediate insulating layer.

* * * * *